US012561026B2

(12) United States Patent
Jung

(10) Patent No.: US 12,561,026 B2
(45) Date of Patent: Feb. 24, 2026

(54) DISPLAY DEVICE

(71) Applicant: LG DISPLAY CO., LTD., Seoul (KR)

(72) Inventor: YeounJei Jung, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/512,546

(22) Filed: Nov. 17, 2023

(65) Prior Publication Data

US 2024/0168587 A1 May 23, 2024

(30) Foreign Application Priority Data

Nov. 23, 2022 (KR) ........................ 10-2022-0158066

(51) Int. Cl.
| | |
|---|---|
| *G06F 3/041* | (2006.01) |
| *G06F 3/044* | (2006.01) |
| *H10K 59/124* | (2023.01) |
| *H10K 59/40* | (2023.01) |

(52) U.S. Cl.
CPC .......... *G06F 3/0418* (2013.01); *G06F 3/0412* (2013.01); *G06F 3/04164* (2019.05); *H10K*

*59/124* (2023.02); *H10K 59/40* (2023.02); *G06F 3/0446* (2019.05); *G06F 2203/04107* (2013.01)

(58) Field of Classification Search
None
See application file for complete search history.

(56) References Cited

U.S. PATENT DOCUMENTS

| | | | | |
|---|---|---|---|---|
| 2015/0084912 A1* | 3/2015 | Seo | ........................ | G06F 3/0412 |
| | | | | 345/174 |
| 2019/0237533 A1* | 8/2019 | Kim | ...................... | H10K 59/126 |
| 2023/0205357 A1* | 6/2023 | Yoo | ........................ | G06F 3/0446 |
| | | | | 345/173 |
| 2024/0074265 A1* | 2/2024 | Jeong | ................. | H10K 59/1315 |

* cited by examiner

*Primary Examiner* — Ifedayo B Iluyomade

(74) *Attorney, Agent, or Firm* — Morgan, Lewis & Bockius LLP

(57) ABSTRACT

A display device includes a substrate including an active area and a non-active area at a periphery of the active area; a signal line, in the non-active area, configured to supply a display signal; a touch line, over the signal line, configured to supply a touch signal; a first blocking pattern between the signal line and the touch line; and a second blocking pattern connected to the first blocking pattern.

21 Claims, 8 Drawing Sheets

DISPLAY DEVICE

CROSS REFERENCE TO RELATED APPLICATION

This application claims the benefit and priority to Korean Patent Application No. 10-2022-0158066, filed on Nov. 23, 2022, the entire contents of which are hereby expressly incorporated by reference for all purposes as if fully set forth herein.

BACKGROUND

Technical Field

The present disclosure relates to a display device and, more particularly to, for example and without limitation, a display device having a structure by which the sensitivity of touch lines disposed in a peripheral area of the display device is improved.

Discussion of the Related Art

Recent display devices configured to display various types of information to be viewed by user have various sizes, various shapes, and various functions. These display devices may include liquid crystal display devices (LCDs), plasma display panel (PDP) devices, field emission display (FED) devices, electroluminescence display (ELD) devices, electrophoretic display devices (FPDs), light emitting diode (LED) display devices, and the like.

LED display devices are self-emitting display devices, and may be fabricated with light weight and thin profile because no separate light source is required unlike LCDs. In addition, LED display devices are not only advantageous in terms of power consumption due to low voltage driving, but are also superior in terms of color reproduction, response rate, viewing angle, and contrast ratio (CR). Therefore, LED display devices are being researched as next-generation displays.

Display devices may be configured to recognize a user touch and perform input processing on the basis of the recognized touch to provide more diverse functions to users.

Because display devices provide a touch sensing function while displaying images, lines for display driving and lines for touch sensing may be disposed on a display panel. In some cases, a display driving line and a touch sensing line may overlap or to be adjacent to each other.

The description provided in the description of the related art section should not be assumed to be prior art merely because it is mentioned in or associated with the description of the related art section. The description of the related art section may include information that describes one or more aspects of the subject technology.

SUMMARY

In display devices providing a touch sensing function while displaying images, it is newly recognized by the inventor of the present application that, due to parasitic capacitance between the lines for display driving and the lines for touch sensing, the performance of touch sensing may be degraded. The present disclosure is proposed to better address such problem, for example, for reducing or minimizing noise in touch sensing signals due to the parasitic capacitance between a display driving line and a touch sensing line.

Accordingly, embodiments of the present disclosure are directed to a display device that substantially obviates one or more of the issues due to limitations and disadvantages of the related art.

An aspect of the present disclosure is to provide a display device including a blocking pattern between a display driving line and a touch line to block touch noise caused by a display driving signal line.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device may comprise a substrate including an active area and a non-active area at a periphery of the active area; a signal line, in the non-active area, configured to supply a display signal; a touch line, over the signal line, configured to supply a touch signal; a first blocking pattern between the signal line and the touch line; and a second blocking pattern connected to the first blocking pattern.

In another aspect, a display device may comprise a substrate including an active area and a non-active area at a peripheral of the active area; a signal line, in the non-active area, configured to supply a display signal; a touch line, over the signal line, configured to supply a touch signal; a blocking pattern between the signal line and the touch line, wherein the blocking pattern includes a conductive material and is configured to have a constant voltage applied thereto.

According to embodiments, the display device may include the blocking pattern between the display driving line and the touch line to block touch noise caused by the display driving signal line.

According to embodiments, the display device may reduce or minimize electric field interference of the touch line, thereby improving touch sensitivity of a peripheral area.

According to embodiments, the display device may include the blocking pattern between the signal line for display driving and the touch line for touch sensing, thereby enabling lower power consumption.

It is to be understood that both the foregoing general description and the following detailed description are exemplary and explanatory and are intended to provide further explanation of the inventive concepts as claimed.

BRIEF DESCRIPTION OF DRAWINGS

The accompanying drawings, which are included to provide a further understanding of the disclosure and are incorporated in and constitute a part of this application, illustrate embodiments of the disclosure and together with the description serve to explain various principles.

FIG. 1 is a schematic view illustrating a display device according to an embodiment of the present disclosure;

FIG. 6 illustrates an arrangement of the peripheral area of FIGS. 2 and 4;

DETAILED DESCRIPTION

Figure 2:
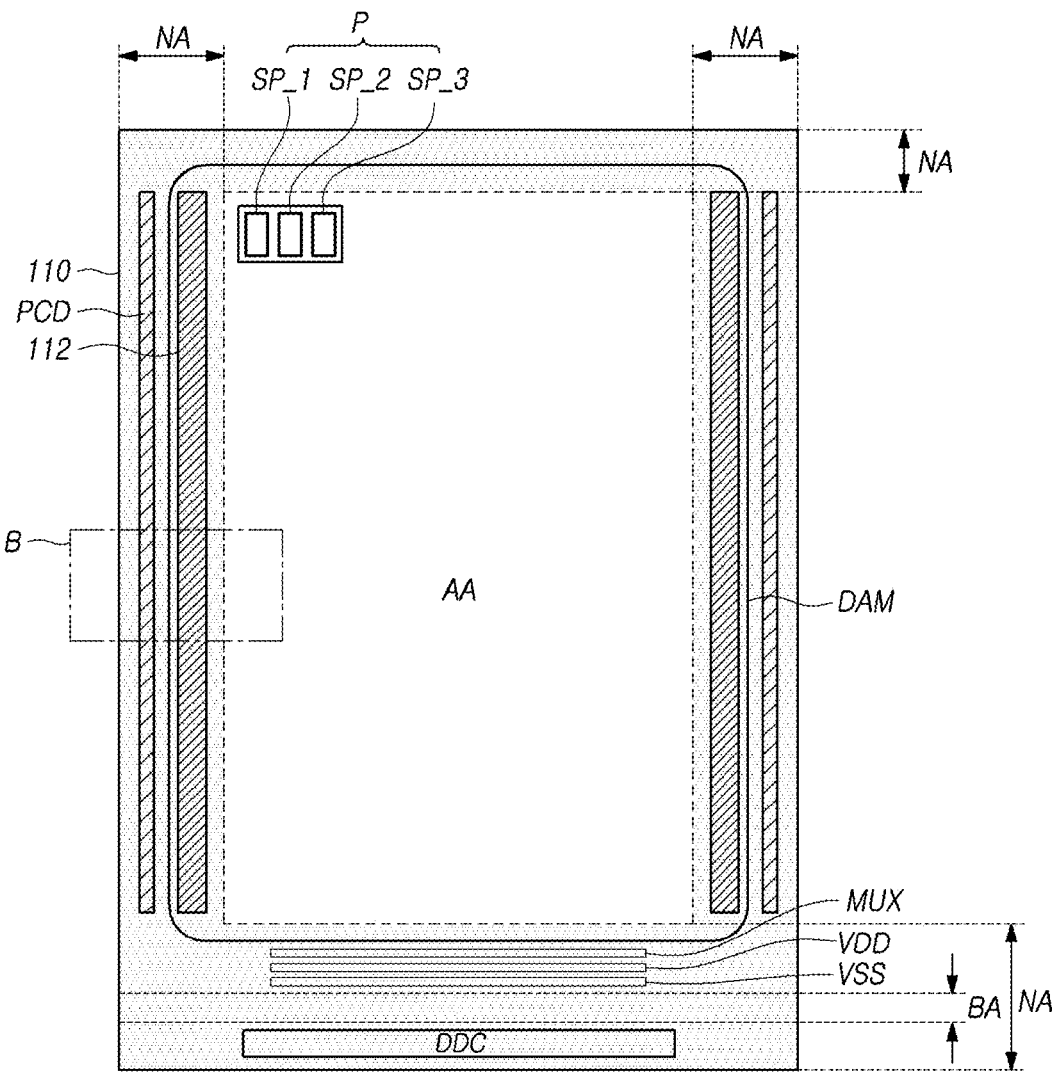
FIG. 2 is a plan view illustrating the display driver unit according to an embodiment of the present disclosure.

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted or may be briefly provided. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations may be selected only for convenience of writing the specification and may be thus different from those used in actual products.

The advantages and features of the present disclosure and methods of the realization thereof will be apparent with reference to the accompanying drawings and detailed descriptions of the embodiments. The present disclosure should not be construed as being limited to the example embodiments set forth herein and may be embodied in a variety of different forms. Rather, these example embodiments are provided so that the present disclosure will be sufficiently thorough and complete to assist those skilled in the art to fully understand the scope of the present disclosure. The scope of the present disclosure shall be defined by the appended Claims and their equivalents.

The shapes, sizes, areas, ratios, angles, numbers, and the like, inscribed in the drawings to illustrate various example embodiments of the present disclosure are merely given by way of example, and the present disclosure is not limited to the embodiments illustrated in the drawings. Throughout this document, the same reference numerals and symbols will be used to designate the same or like components. In the following description of the present disclosure, detailed descriptions of known functions and components incorporated into the present disclosure will be omitted or may be briefly provided when it is determined that the description may render the subject matter in some embodiments of the present disclosure somewhat unclear. It will be understood that the terms "comprise," "include," "contain," "constitute," "make up of," "formed of," "have," and any variations thereof used herein are intended to cover non-exclusive inclusions unless explicitly stated to the contrary. Descriptions of components in the singular form used herein are intended to include descriptions of components in the plural form, unless explicitly stated to the contrary.

In the analysis of a component, it shall be understood that an error range or tolerance range is included therein, even in the situation in which there is no explicit description of such an error or tolerance range.

When spatially relative terms, such as "on," "over," "above," "under," "below," "beside," "beneath," "near," "close to," "adjacent to," "next to," "on a side of" or the like, are used herein for descriptions of relationships between one element or component and another element or component, one or more intervening elements or components may be present between the one and other elements or components, unless a term, such as "immediately," "close(ly) or "directly," is used.

When temporally relative terms, such as "after," "subsequent," "following," "next" and "before" are used to define a temporal relationship, a non-continuous case may be included unless a more limiting term, such as "just," "immediately" or "directly" is used.

In addition, terms, such as "first" and "second" may be used herein to describe a variety of components. It should be understood, however, that these components are not limited by these terms. These terms are merely used to discriminate one element or component from other elements or components. Thus, a first component referred to as first hereinafter may be a second component within the technical idea of the present disclosure.

In addition, terms, such as first, second, A, B, (a), or (b), may be used herein when describing components of the present disclosure. Each of these terminologies is not used to define an essence, order, or sequence of a corresponding component but used merely to distinguish the corresponding component from other components. In the case that it is described that a certain structural component element or layer is "connected," "coupled," "adhered" or "joined" to another structural element or layer, it should be interpreted that another structural element or layer may be "connected," "coupled to," "adhered" or "joined" to the structural element or layer directly or indirectly.

A term "at least one" is typically understood as including any and all combinations of one or more of the associated components. For example, the meaning of "at least one of a first item, a second item, and a third item" denotes a combination of two or more components of the first component, the second component, and the third component as well as each individual component, the first component, the second component, or the third component.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term "part" or "unit" may apply, for example, to a separate circuit or structure, an integrated circuit, a computational block of a circuit device, or any structure configured to perform a described function as should be understood to one of ordinary skill in the art.

A term "device" used herein may refer to a display device including a display panel and a driver for driving the display panel. Examples of the display device may include a liquid crystal module (LCM), an organic light-emitting diode (OLED) module, and the like. In addition, examples of the device may include a notebook computer, a television, a computer monitor, an automotive device, wearable device and an automotive equipment device, and a set electronic device (or apparatus) or a set device (or apparatus), for example, a mobile electronic device such as a smartphone or an electronic pad, which are complete products or final products respectively including the LCM, the OLED module, and the like, but embodiments of the present disclosure are not limited thereto.

Thus, the "device" used herein may include a display device such as an LCM or OLED module, an application including the LCM, the OLED module, and the like, and a set device that is an end consumer device.

In addition, in some embodiments, the LCM and the OLED module each including a display panel, a driver, and the like may be referred to as the "display device," and an electronic device as a final product including the LCM and/or the OLED module may be referred to as a "set device" to be distinguished from the "display device." For example, the display device may include a display panel such as an LCD display panel or an OLED display panel and a source printed circuit board (PCB) serving as a control part to drive the display panel. The set device may further include a set PCB serving as a set control part electrically connected to the source PCB to drive the entirety of the set device.

The display panel according to embodiments of the present disclosure may be implemented as any display panel selected from among a liquid crystal display (LCD) panel, plasma display panel (PDP) panel, field emission display (FED) panel, electroluminescence display (ELD) panel, a mini LED display panel, an OLED display panel, and an electroluminescent display panel and the like, but is not limited thereto. For example, the display panel according to embodiments may be a display panel that may be vibrated or oscillated by a vibration device to generate sound. The display panel used in the display device according to example embodiments is not limited to a specific shape or size.

Portions or the entirety of respective features of various embodiments of the present disclosure may be coupled to or combined with each other. In technical terms, such features may work in concert with each other or be driven in a variety of manners. Respective embodiments may be implemented independently of or in association with each other.

Hereinafter, example embodiments of the present disclosure will be described in conjunction with the accompanying drawings. The scales, sizes and thicknesses of components illustrated in the accompanying drawings are different from actual scales, sizes and thicknesses for the sake of brevity, and thus the present disclosure is not limited to the scales, sizes and thicknesses illustrated in the drawings.

Hereinafter, a variety of embodiments of the present disclosure will be described in detail with reference to the drawings.

Figure 1:
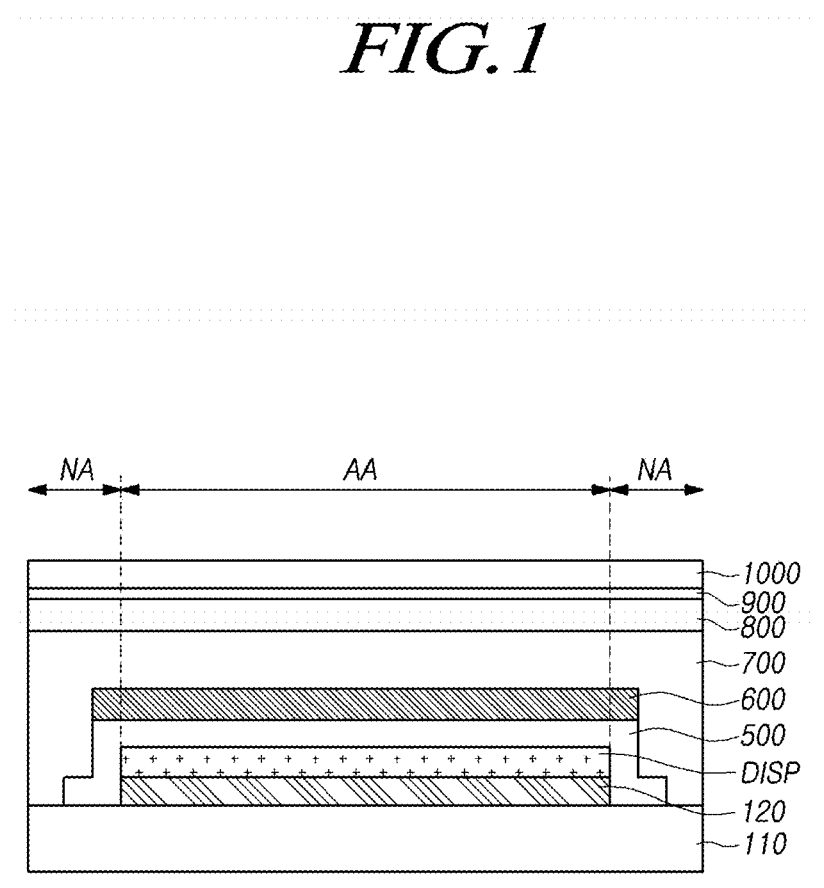

FIG. 1 is a schematic view illustrating a display device 100 according to an embodiment of the present disclosure. All the components of each light-emitting display device according to all embodiments of the present disclosure are operatively coupled and configured.

With reference to FIG. 1, the display device 100 may include a substrate 110 having an active area (or display area) AA and a non-active area NA at a peripheral of (e.g., surrounding) the active area AA.

A display driver unit DISP including a thin-film transistor (TFT) and a light-emitting device layer may be disposed on the substrate 110. An encapsulation layer 500 and a touch sensor layer 600 may be disposed on the display driver unit DISP. The display driver unit DISP, the encapsulation layer 500, and the touch sensor layer 600 will be described in detail later with reference to FIGS. 3 to 8.

A polarizer (or polarizer plate) 800 may be disposed on the touch sensor layer 600. The polarizer 800 may reduce reflection of external light entering the display device. For example, the display panel contains a variety of metal materials applied to a thin-film transistor, a light-emitting device layer 400, conductive lines, and the like. External light entering the display device may be reflected from the metal material, thereby reducing the visibility of the display device 100. Thus, the polarizer 800 may be disposed on one surface of the display device 100 to reduce or prevent the reflection of external light, thereby improving the outdoor visibility of the display device 100. The polarizer 800 may be omitted depending on the structure of the display device 100 or the like.

A first adhesive layer 700 may be between the touch sensor layer 600 and the polarizer 800. The touch sensor layer 600 and the polarizer 800 may be bonded using the first adhesive layer 700. The first adhesive layer 700 may include an adhesive material, for example, an optically clear adhesive (OCA), a pressure sensitive adhesive (PSA), or the like, but is not limited thereto. The first adhesive layer 700, together with the encapsulation layer 500, may protect the display driver unit DISP from external moisture, oxygen, and foreign matter.

A front member 1000 may be on the polarizer 800. The front member 1000 may protect the polarizer 800, the display driver unit, the touch sensor layer 600, and the like disposed below the front member 1000 from external impact, moisture, heat, and the like. The front member 1000 may include a material having impact resistance and light transmittance. For example, the front member 1000 may be a substrate formed of glass or a film formed of a plastic material, such as poly(methyl methacrylate) (PMMA), polyimide (PI), or polyethylene terephthalate (PET), but is not limited thereto. In addition, the "front member 1000" is an exemplary term. The front member 1000 may be also referred to using a variety of other terms, such as a cover window, a window cover, or cover glass, but is not limited thereto.

The front member 1000 may be bonded to the substrate 110 by a bonding process after manufacturing processes of components disposed on the substrate 110 are completed. A second adhesive layer 900 may be disposed between the polarizer 800 and the front member 1000. The polarizer 800 and the front member 1000 may be bonded using the second adhesive layer 900. The second adhesive layer 900 may include an adhesive material, for example, an optically clear adhesive (OCA) or a pressure sensitive adhesive (PSA), but is not limited thereto.

It is to be noted that one or more elements such as buffer layer 120, the first adhesive layer 700, the polarizer 800, the second adhesive layer 900 and the front member 1000 are provided for illustrative only, and thus may be omitted from the display device of the embodiments of the present disclosure, and one or more additional element may also be added into the display device.

Hereinafter, the display driver unit will be described with reference to FIGS. 2 and 3.

FIG. 2 is a plan view illustrating the display driver unit DISP according to an embodiment of the present disclosure.

Figure 3:
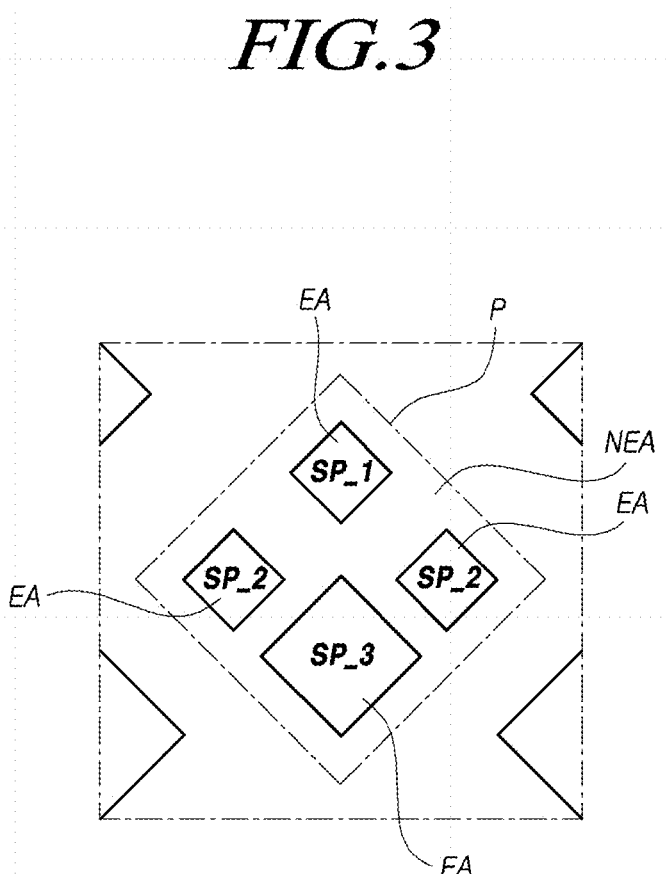
FIG. 3 illustrates an arrangement of subpixels of the display driver unit illustrated in FIG. 2.

FIG. 3 illustrates an arrangement of subpixels of the display driver unit illustrated in FIG. 2.

The display driver unit DISP may include a thin-film transistor 200 and a light-emitting device layer 400.

As shown in FIG. 2, the substrate 110 may include an active area AA and a non-active area NA at a peripheral of (e.g., surrounding) the active area AA. The non-active area NA of the substrate 110 may be disposed adjacent to and outside of the active area AA.

The active area AA is an area in which a plurality of pixels P are disposed to display images. Each of the pixels P may include a plurality of subpixels SP, e.g., SP_1, SP_2, and SP_3.

The plurality of subpixels SP are respective units that emit light. The subpixels SP may generate red, green, blue, or white light, but the present disclosure is not limited thereto.

A thin-film transistor and a light-emitting device layer may be disposed on each of the subpixels SP_1, SP_2, and SP_3. For example, a display device and a circuit part driving the display device may be disposed in each of the plurality of subpixels SP.

Each of the subpixels SP may include two or more thin-film transistors and a storage capacitor. For example, each subpixel SP may have a 2T1C structure including two transistors and a single capacitor, but is not limited thereto. Rather, each subpixel SP may have, for example, a 3T1C, 4T1C, 5T1C, 6T1C, 7T1C, 3T2C, 4T2C, 5T2C, 6T2C, 7T2C, or 8T2C and the like structure.

As shown in FIG. 3, the substrate 110 may include emitting areas EA and a non-emitting area NEA surrounding the emitting areas EA. A plurality of emitting areas EA may be disposed on the top of the substrate and spaced apart from each other. The non-emitting area NEA may be disposed to surround the emitting areas EA.

Figure 7:
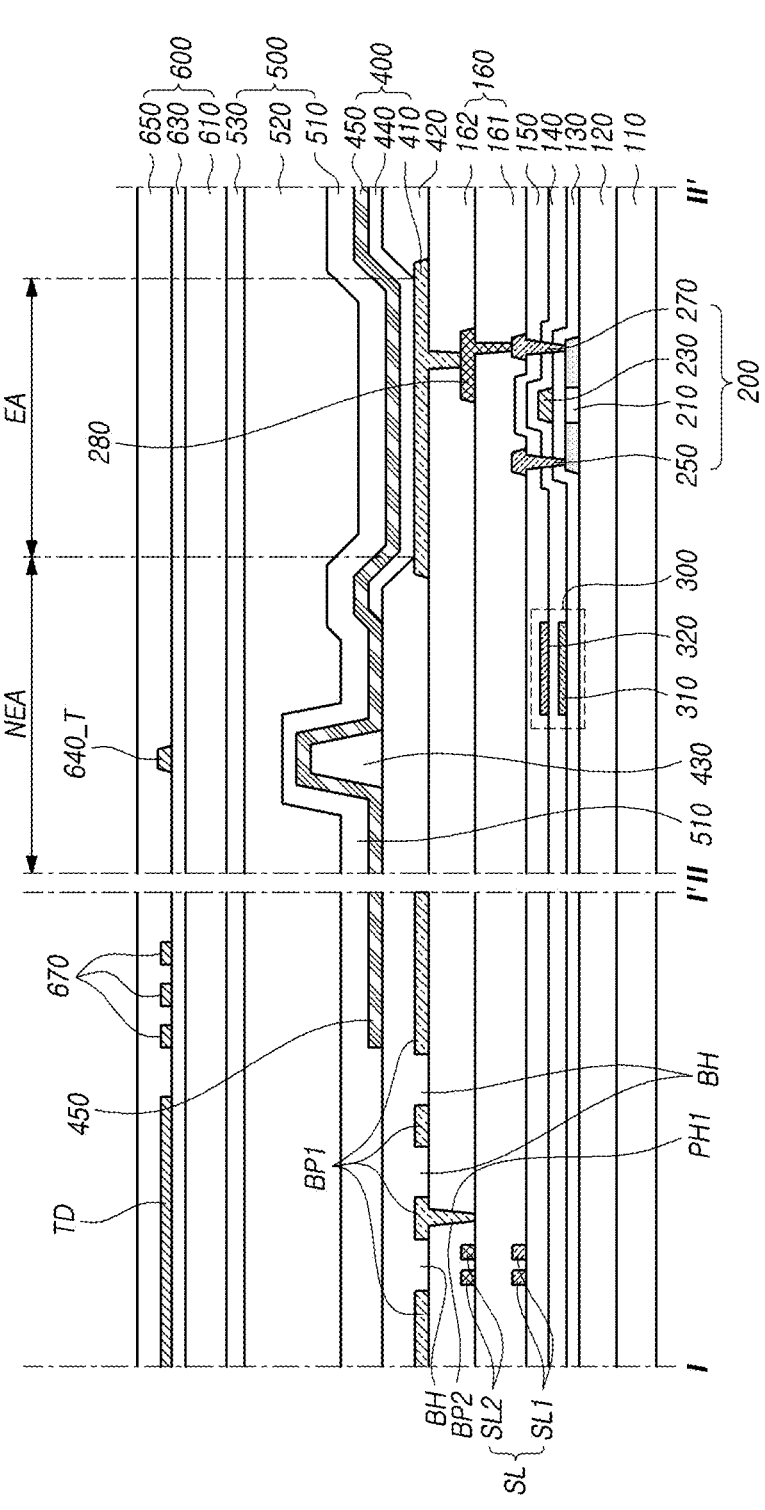
FIG. 7 is a cross-sectional view illustrating the display driver unit and the touch sensor layer according to an embodiment of the present disclosure disposed on a substrate.

Each of the emitting areas EA is an area through which light from an emitting layer is emitted. With reference to FIG. 7, which will be described in further detail later, the emitting areas EA may be areas on which a bank 420 is not disposed. The non-emitting area NEA is an area through which no light from the emitting layer is emitted. Also, the non-emitting area NEA may be an area on which the bank 420 is disposed. Each of the first to third subpixels SP_1, SP_2, and SP_3 may include an emitting area EA.

As illustrated in FIG. 2, single subpixels SP generating different colors of light may be disposed in a single pixel P. For example, a single pixel P may include a single first subpixel SP_1, a single second subpixel SP_2, and a single third subpixel SP_3.

Alternatively, as illustrated in FIG. 3, in a single pixel P, at least one subpixel type among the subpixels SP generating different colors of light may be provided as two or more subpixels. For example, at least two second subpixels SP_2 may be disposed.

The shape of each of the first subpixel SP_1, the second subpixel SP_2, and the third subpixel SP_3 may be one selected from among a rectangle, a pentagon, a hexagon, an octagon, a circle, and an ellipse, but the shape is not limited thereto.

The first subpixel SP_1, the second subpixel SP_2, and the third subpixel SP_3 may generate different colors of light. The first subpixel SP_1, the second subpixel SP_2, and the third subpixel SP_3 may generate light having at least one color among red, green, and blue.

The area of the third subpixel SP_3 may be greater than the area of another subpixel. The third subpixel SP_3 may be disposed to further extend towards another subpixel to have a greater area than that of the other subpixel.

The non-active area NA is an area on which no images are displayed. A variety of conductive lines, driver circuits, and the like for driving a plurality of subpixels SP disposed in the active area AA are disposed in the non-active area NA. For example, a variety of integrated circuits (ICs), such as a gate driver IC and a data driver IC, driver circuits, and the like may be disposed in the non-active area NA. The non-active area NA may be a bezel area, and is not limited to a specific term.

The non-active area NA may be disposed around the active area AA. For example, the non-active area NA may be an area surrounding the active area AA. The non-active area NA may be an area in which none of the plurality of subpixels SP are disposed, but is not limited thereto.

It is illustrated in FIG. 2 that the non-active area NA surrounds the quadrangular active area AA. However, neither the shape of the active area AA nor the shape and arrangement of the non-active area NA adjacent to the active area AA is limited to the illustration of FIG. 2. The active area AA and the non-active area NA may have a shape suitable to the design of an electronic device provided with the display device 100. When the electronic device is a display device wearable by a user, the electronic device may have a circular shape like a wristwatch. The concept of embodiments of the present disclosure may be applied to a free-form display device applicable to a vehicle dashboard or the like. The illustrative shape of the active area AA may be one selected from among a rhombus, pentagon, a hexagon, a circle, and an ellipse, but the shape is not limited thereto.

The display device 100 according to the present disclosure may include a variety of additional elements for generating a variety of signals or driving a plurality subpixels SP_1, SP_2, and SP_3 in the active area AA. For example, the display device may include one or more driver circuits for controlling the subpixels SP. The driver circuit for controlling (or driving) the subpixels SP_1, SP_2, and SP_3 may include a gate driver circuit 112, a data driver circuit DDC, a multiplexer MUX, an electrostatic discharge (ESD) circuit, power lines, an inverter circuit, signal lines, and the like.

The display device 100 may also include additional elements in addition to one or more elements for driving the subpixels SP_1, SP_2, and SP_3. For example, the display device 100 may include additional elements providing a touch sensing function, a user authentication function (e.g., a fingerprint recognition function, face recognition function or retina recognition function), a multilevel pressure detection function, a tactile feedback function, and the like. The above-described additional elements may be in the non-active area NA or on an external circuit connected to a connection interface. Components related to the touch sensing function will be described in detail with reference to FIGS. 4 and 5.

A pad part may be disposed on one side of the non-active area NA. The pad part is a metal pattern to which an external module, e.g., a flexible printed circuit board (FPCB) or a chip on film (COF), is bonded. Although the pad part is illustrated as being disposed on one side of the substrate 110, the shape or the arrangement of the pad part is not limited thereto.

The gate driver circuit 112 providing a gate signal to thin-film transistors may be disposed on the other side of the non-active area NA. The gate driver circuit 112 includes a variety of gate driver circuits, which may be directly formed on the substrate 110. In this case, the gate driver circuit 112 may be a gate-in-panel (GIP) circuit, the arrangement of the gate driver circuit 112 is not limited thereto.

The gate driver circuit 112 may be disposed between the active area AA of the substrate 110 and a dam DAM disposed in the non-active area NA. The gate driver circuit 112 may include a scan driver circuit, an emission driver circuit, and signal lines, but is not limited thereto.

The signal lines may transfer, and control transfer of, signals supplied by the pad part to the scan driver circuit or the emission driver circuit. For example, the signal lines may be clock lines.

The data driver circuit DDC providing data signals to the thin-film transistors may be disposed on the other side of the non-active area NA. The data driver circuit DDC may include a variety of data driver circuits.

High voltage lines VDD, low voltage lines VSS, the multiplexer MUX, the ESD circuit, and a plurality of connection line parts may be disposed between the active area AA and the data driver circuit DDC.

The high voltage lines VDD, the low voltage lines VSS, the multiplexer MUX, and the ESD circuit may be disposed between the active area AA and a bending area BA.

The connection line parts may be disposed in the non-active area NA. For example, the connection line parts may be disposed in the bending area BA of the non-active area NA in which the substrate may be curved or bent. The connection line parts may be configurations for transferring signals (e.g., voltages) from an external module bonded to the active area AA or the pad part, to circuits or elements such as the gate driver circuit 112 and the data driver circuit DDC. For example, a variety of signals for driving the gate driver circuit 112, as well as a variety of other signals, such as a data signal, a high voltage signal, and a low voltage signal, may be transferred through the connection line parts.

The dam DAM may be disposed in the non-active area NA to surround the entirety or a portion of the active area AA. The dam DAM may be disposed to be adjacent to and above the active area AA.

The dam DAM may be disposed on the peripheral portion of the active area AA in order to control flow of a portion of an encapsulation layer disposed on the light-emitting device layer, the portion containing an organic material. The dam DAM may be a single dam DAM or a plurality of dams DAM.

The dam DAM may be disposed between the active area AA and the high voltage lines VDD, the low voltage lines VSS, the multiplexer MUX, or the ESD circuit.

Panel crack detectors PCD may be further disposed in portions of the non-active area NA of the substrate 110.

The panel crack detectors PCD may be disposed between edges (or end portions) of the substrate 110 and the dam DAM. Alternatively, the panel crack detectors PCD may be disposed below the dam DAM such that at least a portion of the panel crack detectors PCD may overlap the dam DAM.

Hereinafter, the touch sensor layer will be described with reference to FIGS. 4 and 5.

Figure 4:
FIG. 4 is a plan view illustrating a touch sensor layer according to an embodiment of the present disclosure.
Figure 5:
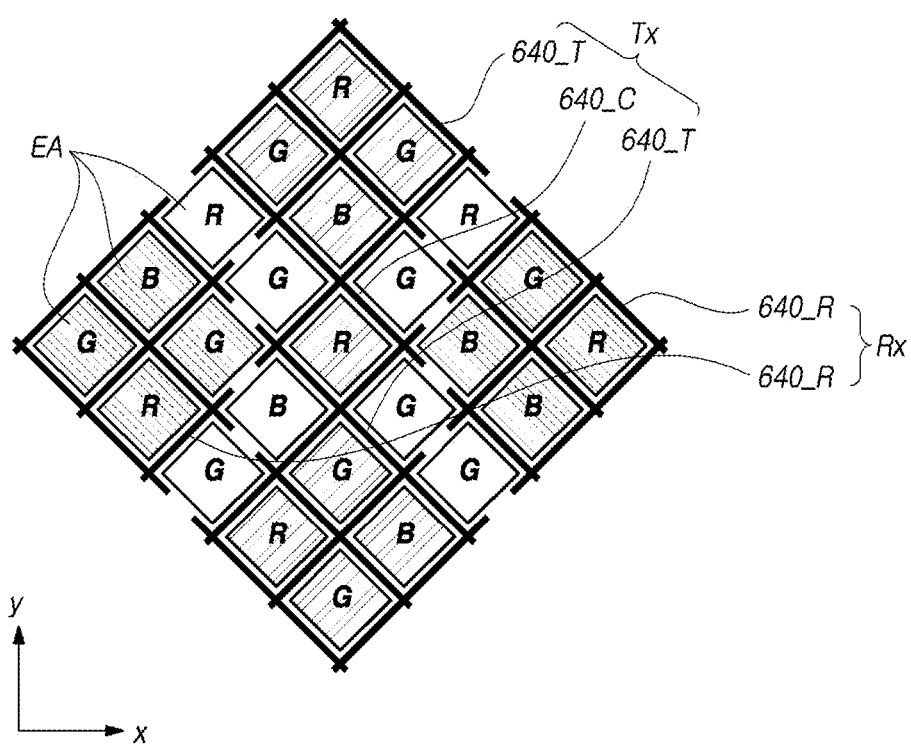
FIG. 5 illustrates an arrangement of touch blocks of the touch sensor layer illustrated in FIG. 4.

FIG. 4 is a plan view illustrating the touch sensor layer according to an embodiment of the present disclosure, and FIG. 5 illustrates an arrangement of touch blocks of the touch sensor layer illustrated in FIG. 4. FIG. 5 is an enlarged view of a portion of touch electrodes disposed in area A of the touch sensor layer illustrated in FIG. 4.

One or more first touch blocks Rx and one or more second touch blocks Tx may be disposed in the active area AA of the display device 100. The first touch blocks Rx may include one or more first touch electrodes 640_R and one or more first touch connection electrodes. The second touch blocks Tx may include one or more second touch electrodes 640_T and one or more second touch connection electrodes 640_C.

The one or more first touch blocks Rx extend in a first direction (or X-axis direction). The first touch blocks Rx may include one or more first touch electrodes 640_R disposed to be spaced apart predetermined distances from each other.

The one or more first touch electrodes 640_R may be electrically connected in the first direction (or X-axis direction). For example, the one or more first touch electrodes 640_R disposed in the first direction (or X-axis direction) may be electrically connected through the first touch connection electrodes. The first touch connection electrodes may be disposed on a different layer from the first touch electrodes 640_R. The first touch connection electrodes may be electrically connected to the first touch electrodes 640_R through holes in a touch insulating layer disposed between the first touch electrodes 640_R and the first touch connection electrodes.

The one or more first touch blocks Rx may be disposed in a second direction (or a Y-axis direction) to be spaced apart predetermined distances from each other. The one or more second touch blocks Tx extend in the second direction (or the Y-axis direction). The second touch blocks Tx may include the one or more second touch electrodes 640_T spaced apart predetermined distances from each other.

The one or more second touch electrodes 640_T may be continuously formed in the second direction (or Y-axis direction) without interruption. For example, the second touch electrodes 640_T disposed in the second direction (or Y-axis direction) may be electrically connected through the second touch connection electrodes 640_C. The second touch electrodes 640_T and the second touch connection electrodes 640_C may be disposed on the same layer. The one or more second touch blocks Tx may be disposed in the first direction (or X-axis direction) to be spaced apart predetermined distances from each other.

The first touch blocks Rx may be spaced apart from the second touch blocks Tx predetermined distances. Thus, the first touch blocks Rx may be electrically separated from the second touch blocks Tx.

The first touch blocks Rx and the second touch blocks Tx may have a metal mesh structure. The first touch electrodes 640_R of the first touch blocks Rx and the second touch electrodes 640_T of the second touch blocks Tx may have a metal mesh structure.

The metal mesh structure will be described with reference to FIG. 5.

The first touch electrodes 640_R, the second touch electrodes 640_T, the first touch connection electrodes, and the second touch connection electrodes 640_C disposed in the active area AA may have a mesh pattern in which metal lines having a small line width intersect each other. The mesh pattern may have a rhombic shape. In addition, the shape of the mesh pattern may be one selected from among a rectangle, a pentagon, a hexagon, a circle, and an ellipse, but is not limited thereto.

Open areas may be formed inside the mesh pattern of the first touch electrodes 640_R and the second touch electrodes 640_T. For example, the thin-film transistor 200 and the light-emitting device layer 400 of the display driver unit DISP may be disposed in each of the open areas of the first touch electrodes 640_R and the second touch electrodes 640_T.

The first touch electrodes 640_R, the second touch electrodes 640_T, the first touch connection electrodes, and the second touch connection electrodes 640_C are designed to have a narrow line width so as to overlap the bank 420 provided in the non-emitting area while not overlapping red (R), green (G), and blue (B) emitting areas. For example, the line width of the first touch electrodes 640_R, the second touch electrodes 640_T, the first touch connection electrodes, and the second touch connection electrodes 640_C may be smaller than or equal to a width of the bank 420, and thus may be fully overlapped with the bank 420. However, embodiments of the present disclosure are not limited thereto.

For the expression that an element or layer "contacts," "overlaps," or the like with another element or layer, the element or layer can not only directly contact, overlap, or the like with another element or layer, but also indirectly contact, overlap, or the like with another element or layer with one or more intervening elements or layers disposed or interposed between the elements or layers, unless otherwise specified.

Although it has been described herein that the first touch blocks Rx extend in the first direction (or X-axis direction) and the second touch blocks Tx extend in the second direction (or Y-axis direction), the first touch blocks Rx may extend in the second direction (or Y-axis direction) and the second touch blocks Tx may extend in the first direction (or X-axis direction).

First touch lines 670, second touch lines 680, and a touch driver circuit TDC may be disposed in the non-active area NA of the display device 100. Each of the first touch blocks Rx and the second touch blocks Tx may be electrically connected to a corresponding touch line. For example, the first touch blocks Rx may be electrically connected to the first touch lines 670, and the second touch blocks Tx may be electrically connected to the second touch lines 680. The first touch lines 670 may be disposed between a signal line SL of the gate driver circuit 112 disposed below the touch sensor layer 600 and the active area AA.

The first touch blocks Rx and the second touch blocks Tx may be connected to the touch driver circuit TDC disposed in a portion of the non-active area NA through the first touch lines 670 and the second touch lines 680. Each of the first touch blocks Rx and the second touch blocks Tx may be connected to the touch driver circuit TDC to transmit or receive a corresponding signal.

The touch driver circuit TDC may receive a touch sensing signal from the first touch blocks Rx or the first touch electrodes 640_R. In addition, the touch driver circuit TDC may transmit a touch driving signal to the second touch blocks Tx or the second touch electrodes 640_T. The touch driver circuit TDC may detect a user touch operation on the basis of mutual capacitance between the first touch blocks Rx and the second touch blocks Tx. For example, when the touch operation is performed on the display device 100, there may be a change in capacitance between the first touch blocks Rx and the second touch blocks Tx. The touch driver circuit TDC may determine touch coordinates by detecting such a change in capacitance.

It is to be noted that the above description of the structure and arrangement of the touch electrodes and the touch lines are provided for illustrative only, and thus may be variously amended if necessary. For example, the above mutual capacitance structure of the touch sensor layer may be replaced with a self-capacitance touch electrode structure, and embodiments of the present disclosure are not limited thereto.

Hereinafter, the display device according to the present disclosure will be described in detail with reference to FIGS. 6 and 7.

Figure 6:
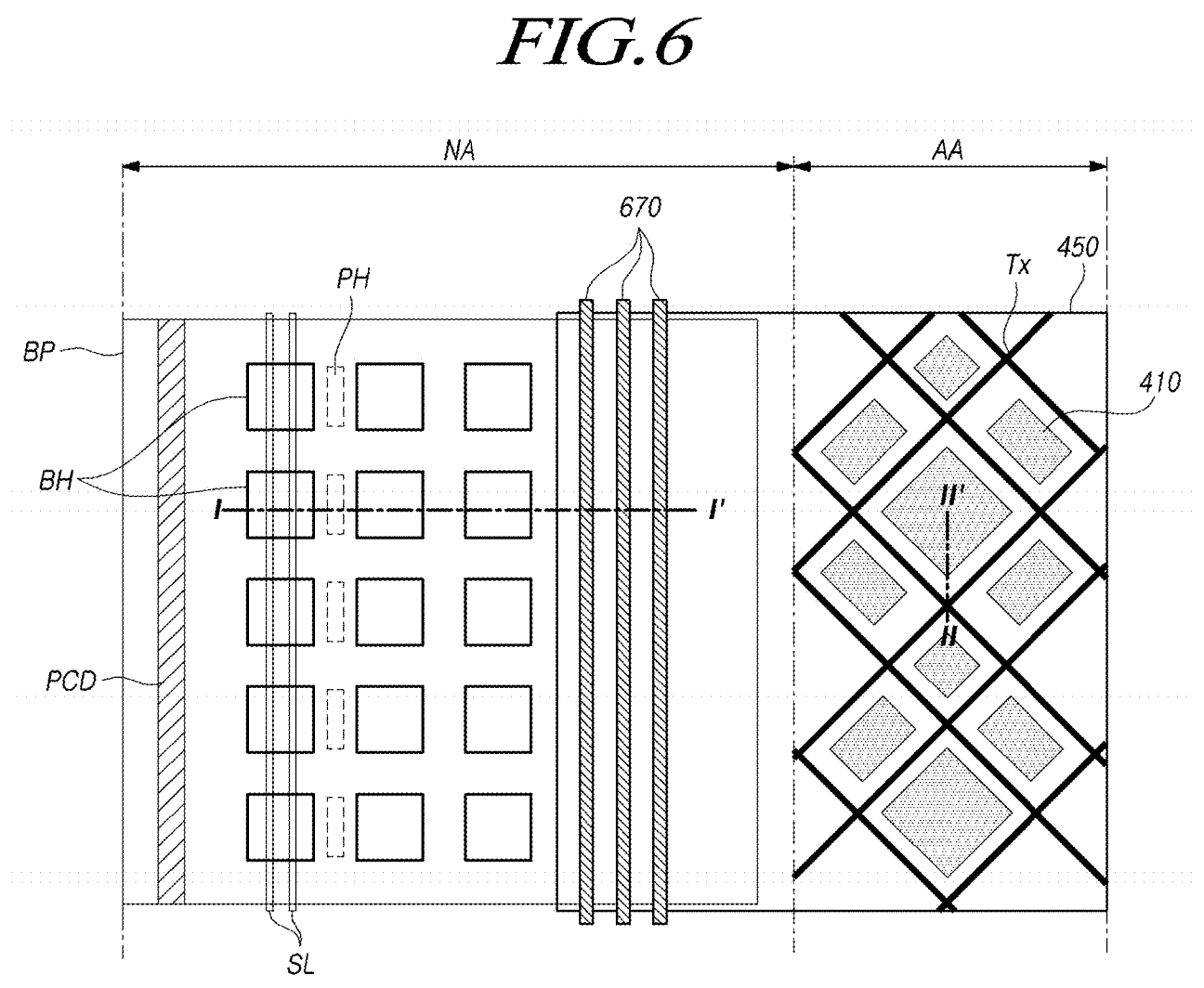

FIG. 6 illustrates an arrangement of the peripheral area of FIGS. 2 and 4. Specifically, FIG. 6 is an enlarged view of area B in FIGS. 2 and 4. FIG. 7 is a cross-sectional view illustrating the display driver unit and the touch sensor layer according to an embodiment of the present disclosure disposed on a substrate. FIG. 7 is a cross-sectional view taken along line I-I' and line II-II' in FIG. 6.

With reference to FIGS. 6 and 7, the thin-film transistor 200 and the light-emitting device layer 400 of the display driver unit DISP may be disposed in the active area AA of the substrate 110. The first touch blocks Rx and the second touch blocks Tx of the touch sensor layer 600 may be disposed in the active area AA of the substrate 110.

The encapsulation layer 500 may be disposed between the display driver unit DISP, including the thin-film transistor 200 and the light-emitting device layer 400, and the touch sensor layer 600.

A plurality of signal lines SL through which a display driving signal or a voltage is supplied may be disposed in the non-active area NA of the substrate 110. For example, the signal lines SL are conductive lines included in a gate driver, and may transfer and control transfer of a signal provided from the pad part to a scan driver circuit or an emission driver circuit. For example, the signal lines may be clock lines. A plurality of touch lines connected to the first touch blocks Rx and the second touch blocks Tx may be disposed in the non-active area NA of the substrate 110.

On the cross-section, a cathode 450 and a blocking pattern may be disposed between the signal lines SL and the touch lines. The blocking pattern may be made of a conductive material and may be applied with a constant voltage.

The signal lines SL may be respectively disposed not to overlap the first touch lines 670 to reduce or prevent noise when a touch sensing signal is detected through the first touch lines 670. The signal lines SL may include first signal lines SL1 and second signal lines SL2 disposed on a different layer from the first signal lines SL1.

The blocking pattern may surround the active area AA, with at least a portion thereof being located inside the boundary of the active area AA. Alternatively, the blocking pattern may be disposed outside the active area AA to be spaced apart from the boundary of the active area AA. The blocking pattern may include a first blocking pattern BP1 and a second blocking pattern BP2.

The blocking pattern may be a blocking layer including the first blocking pattern BP1 and a plurality of blocking pattern holes BH. The plurality of blocking pattern holes BH may be in the blocking layer to reduce or prevent the light-emitting device layer 400 from being deteriorated due to outgassing generated in a planarization layer.

The second blocking pattern BP2 may extend from the first blocking pattern BP1 to be vertically disposed. Because the second blocking pattern BP2 are between signal lines SL and the touch lines, the effect of noise originating from the signal lines SL on the touch lines may be reduced.

A touch dummy TD may be further disposed in a portion of the non-active area NA of the substrate 110. The touch dummy TD may be disposed between the touch lines and an edge (or an end portion) of the substrate 110. The touch dummy TD may also be disposed outside the touch line and overlapping with the signal line.

The touch dummy TD is insulated from the touch lines and the touch blocks, and may be include a conductive material. A constant voltage may be applied to the touch dummy TD. The touch dummy TD may distribute noise due to parasitic capacitance caused by the signal lines SL of the gate driver, thereby reducing noise due to the signal lines SL. The touch dummy TD may include a same material as that of the touch line and disposed on a same layer as the touch line.

Hereinafter, the cross-section of the display device according to the present disclosure will be described in detail with reference to FIG. 7.

The substrate 110 may support a variety of components of the display device. The substrate 110 may be formed of glass or a flexible plastic material. For example, the substrate 110 may include at least one selected from among polyimide (PI), poly(methyl methacrylate) (PMMA), polyethylene terephthalate (PET), polyethersulfone, and polycarbonate, but is not limited thereto.

When the substrate 110 is formed of polyimide, the substrate 110 may include two polyimide portions. In addition, an inorganic film may be further disposed between the two polyimide portions. Alternatively, the substrate 110 may include a plurality of polyimide layers. In addition, an inorganic film may be further disposed between any two polyimide layers among the plurality of polyimide layers.

The substrate 110 may be referred to as conceptually including devices and function layers provided on the substrate 110, for example, a switching thin-film transistor, a driving thin-film transistor connected to the switching thin-film transistor, an organic light-emitting device connected to the driving thin-film transistor, a passivation layer, and the like, but is not limited thereto.

A buffer layer 120 may be disposed on the entire surface of the substrate 110. The buffer layer 120 may include, for example, an inorganic insulating material such as silicon nitride (SiNx) or silicon oxide (SiOx) or an organic insulating material, such as, benzocyclobutene, an acrylic resin, an epoxy resin, a phenolic resin, a polyamide resin, and a polyimide resin, but is not limited thereto. The buffer layer 120 may be a single layer of SiNx or SiOx or a multilayer of thereof. When the buffer layer 120 has a multilayer structure, SiNx and SiOx may be alternately formed. The buffer layer 120 may be omitted depending on the type and material of the substrate 110, the structure and type of the thin-film transistor, and the like.

The thin-film transistor 200 may be disposed on the buffer layer 120 in the active area AA. The thin-film transistor 200 may include a semiconductor pattern 210, a gate electrode 230, a source electrode 250, and a drain electrode 270.

Although only the driving thin-film transistor 200 among a variety of thin-film transistors that may be included in the display device 100 is illustrated for the sake of brevity, other thin-film transistors, such as a switching thin-film transistor may be included in the display device 100. In addition, although the thin-film transistor 200 has been described as having a top gate structure for the sake of brevity, the thin-film transistor is not limited thereto and may have other structures such as a bottom gate structure.

The semiconductor pattern 210 of the thin-film transistor 200 may be on the buffer layer 120. The semiconductor pattern 210 may include a polycrystalline semiconductor. For example, the polycrystalline semiconductor may be low temperature polysilicon (LTPS) having low mobility, but is not limited thereto. When the semiconductor pattern 210 is formed of polycrystalline semiconductor or includes polycrystalline semiconductor, power consumption of the thin-film transistor 200 is low and reliability is high.

In addition, the semiconductor pattern 210 may include an oxide semiconductor. For example, the semiconductor pattern 210 may include one of indium-gallium-zinc-oxide (IGZO), indium-zinc-oxide (IZO), indium-gallium-tin-oxide (IGTO), and indium-gallium-oxide (IGO), but the material is not limited thereto. When the semiconductor pattern 210 is formed of an oxide semiconductor or includes an oxide semiconductor, a change in the luminance of subpixels in low speed driving may be reduced or minimized due to a superior leakage current blocking effect.

When the semiconductor pattern 210 includes polycrystalline semiconductor or oxide semiconductor, or includes polycrystalline semiconductor or oxide semiconductor, a conductorized portion may be present in a portion of the semiconductor pattern 210.

The semiconductor pattern 210 may be formed of amorphous silicon (a-Si) or a variety of organic semiconductor materials such as pentacene or include amorphous silicon (a-Si) or a variety of organic semiconductor materials such as pentacene, but is not limited thereto.

A first insulating layer 130 may be disposed in the entire area of the substrate 110 above the semiconductor pattern 210. The first insulating layer 130 may be disposed between the semiconductor pattern 210 and the gate electrode 230 to insulate the semiconductor pattern 210 from the gate electrode 230.

The first insulating layer 130 may include, for example, an inorganic insulating material such as SiNx or SiOx or an organic insulating material such as benzocyclobutene, an acrylic resin, an epoxy resin, a phenolic resin, a polyamide resin, and a polyimide resin, but is not limited thereto.

The first insulating layer 130 may have holes through which the source electrode 250 and the drain electrode 270 of the thin-film transistor 200 are electrically connected to the semiconductor pattern 210. The gate electrode 230 of the thin-film transistor 200 may be disposed on the first insulating layer 130 in the active area AA. The gate electrode 230 may be disposed to overlap the semiconductor pattern 210.

A storage capacitor 300 may include a first capacitor electrode 310 and a second capacitor electrode 320. The storage capacitor 300 may store a data voltage applied through a data line for a predetermined time and supply the stored data voltage to an anode 410.

The first capacitor electrode 310 of the storage capacitor 300 may be disposed on the first insulating layer 130 in the active area AA. The gate electrode 230 and the first capacitor electrode 310 may be disposed on the same layer. For example, the gate electrode 230 and the first capacitor electrode 310 may be disposed on the first insulating layer 130. The gate electrode 230 and the first capacitor electrode 310 may be formed in the same process, but present disclosure is not limited thereto.

The gate electrode 230 and the first capacitor electrode 310 may have a single-layer structure or a multilayer structure including of one or more selected from among molybdenum (Mo), copper (Cu), titanium (Ti), aluminum (Al), chromium (Cr), gold (Au), nickel (Ni), neodymium (Nd), tungsten (W), a transparent conductive oxide (TCO), or alloys thereof, but material is not limited thereto.

A second insulating layer 140 may be disposed in the entire area of the substrate 110 above the gate electrode 230 and the first capacitor electrode 310. The second insulating layer 140 may be disposed among the gate electrode 230, the source electrode 250, and the drain electrode 270 to insulate the gate electrode 230, the source electrode 250, and the drain electrode 270 from each other.

The second insulating layer 140 may include, for example, an inorganic insulating material such as SiNx or SiOx or an organic insulating material, such as benzocyclobutene, an acrylic resin, an epoxy resin, a phenolic resin, a polyamide resin, and a polyimide resin, but is not limited thereto.

The second insulating layer 140 may have holes through which the source electrode 250 and the drain electrode 270 are electrically connected to the semiconductor pattern 210. The second insulating layer 140 may be formed of, for example, an inorganic insulating material such as SiNx or SiOx or an organic insulating material, but is not limited thereto.

The second capacitor electrode 320 of the storage capacitor 300 may be on the second insulating layer 140 in the active area AA. The second capacitor electrode 320 may be disposed to overlap the first capacitor electrode 310.

The second capacitor electrode 320 may have a single-layer structure or a multilayer structure formed of one or more selected from among Mo, Cu, Ti, Al, Cr, Au, Ni, Nd, W, a transparent conductive oxide, or alloys thereof, but is not limited thereto.

A third insulating layer 150 may be disposed in the entire area of the substrate 110 above the second capacitor electrode 320. The third insulating layer 150 may be disposed among the gate electrode 230, the source electrode 250, and the drain electrode 270 to insulate the gate electrode 230, the source electrode 250, and the drain electrode 270 from each other. The third insulating layer 150 may include, for example, an inorganic insulating material such as SiNx or SiOx or an organic insulating material, such as benzocyclobutene, an acrylic resin, an epoxy resin, a phenolic resin, a polyamide resin, and a polyimide resin, but is not limited thereto.

The third insulating layer 150 may have holes through which the source electrode 250 and the drain electrode 270 are electrically connected to the semiconductor pattern 210. The source electrode 250 and the drain electrode 270 may be on the third insulating layer 150 in the active area AA.

The source electrode 250 and the drain electrode 270 may be electrically connected to the semiconductor pattern 210 through the holes in the first insulating layer 130, the second insulating layer 140, and the third insulating layer 150.

The first signal lines SL1 of the signal lines SL may be disposed on the third insulating layer 150 in the non-active area NA. The first signal lines SL1 may be one or more signal lines. When the first signal lines SL1 are one or more signal lines, the first signal lines may be spaced apart from each other.

The source electrode 250, the drain electrode 270, and the first signal lines SL1 may be on the same layer. For example, the source electrode 250, the drain electrode 270, and the first signal lines SL1 may be on the third insulating layer 150. The source electrode 250, the drain electrode 270, and the first signal lines SL1 may be formed in the same process, but is not limited thereto.

The high voltage lines VDD and the low voltage lines VSS may be further disposed on the third insulating layer 150. High voltages may be supplied through the high voltage lines VDD. Low voltages may be supplied through the low voltage lines VSS.

Each of the source electrode 250, the drain electrode 270, and the first signal lines SL1 may have a single-layer structure or a multilayer structure including one or more selected from among Mo, Cu, Ti, Al, Cr, Au, Ni, Nd, W, a transparent conductive oxide, or alloys thereof, but is not limited thereto. For example, each of the source electrode 250, the drain electrode 270, and the first signal lines SL1 may have a three-layer structure of Ti/Al/Ti formed of conductive metal materials, but is not limited thereto.

A planarization layer 160 may be in the entire area of the substrate 110 above the source electrode 250, the drain electrode 270, and the first signal lines SL1. The planarization layer 160 may protect the thin-film transistor disposed below the planarization layer 160 and reduce or planarize stepped portions caused by a variety of patterns. Although the planarization layer 160 may be provided as a single layer, two or more planarization layers may also be provided in consideration of the arrangement of electrodes.

Because a variety of signal lines increase as the resolution of the display device 100 increases, it is difficult to dispose all conductive lines on a single layer while obtaining minimum distances. Thus, an additional layer may be provided. This additional layer may increase the degree of freedom of the arrangement of conductive lines, thereby making it easier to design the arrangement of conductive lines and/or electrodes. In addition, when the planarization layer 160 having a multilayer structure is formed of a dielectric material, the planarization layer 160 may be used to form capacitance between metal layers.

When the planarization layer 160 is comprised of two layers, the planarization layer 160 may include a first planarization layer 161 and a second planarization layer 162.

For example, a hole may be formed in the first planarization layer 161, and a first connection electrode 280 may be disposed in the hole. The first planarization layer 161, as well as the second planarization layer 162 having a hole above the first connection electrode 280, may be disposed. The anode 410 may be disposed in the hole of the second planarization layer 162. Thus, the thin-film transistor 200 and the anode 410 may be electrically connected through the first connection electrode 280.

One end (or a portion) of the first connection electrode 280 may be connected to the thin-film transistor, and the other end (or another portion) of the first connection electrode 280 may be connected to the anode. The first connection electrode 280 may be disposed on the first planarization layer 161 in the active area AA.

Second signal lines SL2 of the signal lines SL may be disposed on the first planarization layer 161 in the non-active area NA. The second signal lines SL2 may be one or more signal lines. When the second signal lines SL2 are two or more signal lines, the second signal lines SL2 may be spaced apart from each other. At least a portion of the second signal lines SL2 may overlap the first signal lines SL1.

The second blocking pattern BP2 may be on the first planarization layer 161 in the non-active area NA. A first hole PH1 may be formed in the second planarization layer 162, and the second blocking pattern BP2 may be disposed in the first hole PH1. The first hole PH1 may be disposed such that a portion thereof overlaps the first blocking pattern BP1.

The first connection electrode 280, the second signal lines SL2, and the second blocking pattern BP2 may be on the same layer. For example, the first connection electrode 280, the second signal lines SL2, and the second blocking pattern BP2 may be disposed on the first planarization layer 161. The first connection electrode 280 and the second signal lines SL2 may be formed in the same process. Each of the first connection electrode 280 and the second signal lines SL2 may have a single-layer structure or a multilayer structure formed of one or more selected from among Mo, Cu, Ti, Al, Cr, Au, Ni, Nd, W, a transparent conductive oxide, or alloys thereof, but is not limited thereto.

Each of the first planarization layer 161 and the second planarization layer 162 may be formed of at least one material selected from among benzocyclobutene (BCB), an acrylic resin, an epoxy resin, a phenolic resin, a polyamide resin, and a polyimide resin, but is not limited thereto. The first connection electrode 280 may be omitted on the basis of the structure, type, or the like of the display device.

The light-emitting device layer 400 may be on the planarization layer 160 in the active area AA. The light-emitting device layer 400 may include the anode 410, an emitting layer 440, and the cathode 450. The anode 410 may be disposed on the planarization layer 160 in the active area AA.

When the display device 100 is a top emission display device, the anode 410 may be implemented as a light reflecting electrode formed of an opaque conductive material. The anode 410 may be formed of at least one selected from among silver (Ag), aluminum (Al), gold (Au), molybdenum (Mo), tungsten (W), chromium (Cr), or alloys thereof, but is not limited thereto. For example, the anode 410 may have a three-layer structure of Ag/Pd/Cu, but is not limited thereto. Alternatively, the anode 410 may further include a transparent conductive material layer having a high work function such as indium-tin-oxide (ITO).

When the display device 100 is a bottom emission display device, the anode 410 may include a transparent conductive material allowing light to pass therethrough. For example, the anode 410 may be formed of at least one of indium-tin-oxide (ITO) and indium zinc oxide (IZO).

The first blocking pattern BP1 may be disposed on the planarization layer 160 in the non-active area NA. The anode 410 and the first blocking pattern BP1 may be disposed on the same layer. For example, the anode 410 and the first blocking pattern BP1 may be disposed on the second planarization layer 162.

A first blocking pattern BP1 and a second blocking pattern BP2 may be between the signal lines SL and the touch lines. The first blocking pattern BP1 and the second blocking pattern BP2 may be on different layers. At least a portion of the first blocking pattern BP1 may be in contact with the second blocking pattern BP2.

Each of the first blocking pattern BP1 and the second blocking pattern BP2 may be formed of the same material as the anode 410. Each of the first blocking pattern BP1 and the second blocking pattern BP2 may have the same structure as the anode 410. The anode 410, the first blocking pattern BP1, and the second blocking pattern BP2 may be formed in the same process.

The bank 420 may be disposed on the anode 410, the first blocking pattern BP1, the second blocking pattern BP2, and the planarization layer 160. The bank 420 may divide the plurality of subpixels SP, reduce or minimize light leaks, and reduce or prevent color mixing occurring in various fields of view.

The bank 420 may define (or divide) a light-emitting part and a non-light-emitting part. The bank 420 may be disposed in the non-light-emitting part. The bank 420 may have a bank hole through which the light-emitting part and the anode 410 are exposed. The bank 420 may be formed of at least one selected from among inorganic insulating materials such as SiNx and SiOx; organic insulating materials, such as benzocyclobutene, an acrylic resin, an epoxy resin, a phenolic resin, a polyamide resin, and a polyimide resin; a photosensitizer (or photoresist) including a black pigment, but is not limited thereto.

The bank 420 may be formed to be transparent, black, or colored. The bank 420 may be disposed to cover an end portion or end portions of the anode 410.

At least one spacer 430 may be disposed on the bank 420. The spacer 430 may reduce or prevent the light-emitting device layer 400 from being damaged and reduce or minimize the fracture of the display device 100 due to external impact.

The spacer 430 may be formed of the same or substantially the same material as the bank 420, and may be formed at the same time as or in a different process from the bank 420.

The height of the spacer 430 may be higher than the height of the bank 420. The height of the spacer 430 may be in the range of 1 μm to 2 μm, for example.

The emitting layer 440 may be on the anode 410 and the bank 420. The emitting layer 440 may include one of a red organic light-emitting layer, a green organic light-emitting layer, a blue organic light-emitting layer, and a white organic light-emitting layer such that light having a specific color is generated from each of the subpixels SP. When the emitting layer 440 includes a white organic light-emitting layer, a color filter for converting white light from the white organic light-emitting layer into light having another color may be disposed above the emitting layer 440. In addition, a hole injection layer, a hole transport layer, an electron transport layer, an electron injection layer, and the like may be further provided above or below the emitting layer 440, but the present disclosure is not limited thereto.

The emitting layer 440 may be in each of the subpixels SP. The hole injection layer, the hole transport layer, the electron transport layer, and the electron injection layer may be in the entire active area AA.

A plurality of emitting layers 440 may be in each of the subpixels SP. In this case, a charge generation layer may be further provided between two or more emitting layers 440.

The cathode 450 may be disposed on the emitting layer 440. The cathode 450 may extend to the non-active area NA. A portion of the cathode 450 extending to the non-active area NA may overlap the first blocking pattern BP1 or the first touch lines 670. The cathode 450 supplies electrons to the light-emitting device layer 400, and may include a material having a low work function.

When the display device 100 is a top emission display device, the cathode 450 may be include a transparent conductive material allowing light to pass therethrough. For example, the cathode 450 may be formed of at least one of ITO and IZO, but is not limited thereto.

In addition, the cathode 450 may include a translucent conductive material. For example, the cathode 450 may be formed of at least one selected from among alloys such as LiF/Al, CsF/Al, Mg:Ag, Ca/Ag, Ca:Ag, LiF/Mg:Ag, LiF/Ca/Ag, and LiF/Ca:Ag, but the material is not limited thereto.

When the display device 100 is a bottom emission display device, the cathode 450 may be implemented as a light reflecting electrode of an opaque conductive material. For example, the cathode 450 may include at least one selected from among Ag, Al, Au, Mo, W, Cr, or alloys thereof.

The encapsulation layer 500 may be disposed on the cathode 450. The encapsulation layer 500 may protect the light-emitting device layer 400 from external moisture, oxygen, or foreign matter. For example, the encapsulation layer 500 may reduce or prevent permeation of oxygen and moisture from the outside to reduce or prevent the light-emitting material and the electrode material from oxidizing. The encapsulation layer 500 may include a transparent material allowing light generated by the emitting layer to pass therethrough.

The encapsulation layer 500 may include a first encapsulation layer 510, a second encapsulation layer 520, and a third encapsulation layer 530 to reduce or prevent permeation of moisture and oxygen. The first encapsulation layer 510, the second encapsulation layer 520, and the third encapsulation layer 530 may be configured to be alternately stacked on each other.

Each of the first encapsulation layer 510 and the third encapsulation layer 530 may include at least one inorganic material selected from among silicon nitride (SiNx), silicon oxide (SiOx), or aluminum oxide (AlyOz), but is not limited thereto. Each of the first encapsulation layer 510 and the third encapsulation layer 530 may be formed by a vacuum deposition method such as physical vapor deposition (PVD), chemical vapor deposition (CVD) or atomic layer deposition (ALD).

Each of the first encapsulation layer 510 and the third encapsulation layer 530 may be include two or more layers. For example, the first encapsulation layer 510 may have a three-layer structure of SiOx/SiNx/SiOx, but is not limited thereto. Alternatively, the first encapsulation layer 510 may have a four-layer structure of SiOx/SiNx/SiOx/SiNx, but is not limited thereto.

The second encapsulation layer 520 may cover foreign matter or particles that may occur during fabrication processing. In addition, the second encapsulation layer 520 may planarize the surface of the first encapsulation layer 510. For example, the second encapsulation layer 520 may be a particle cover layer, but is not limited to the term. The second encapsulation layer 520 may include an organic material, for example, a polymer, such as silicon oxycarbon (SiOCz) epoxy, polyimide, polyethylene, and acrylate, but is not limited thereto. The second encapsulation layer 520 may include a thermosetting material or a light-curing material that is hardened by heat or light.

The touch sensor layer 600 may be on the encapsulation layer 500. The touch sensor layer 600 may include the first touch electrodes 640_R, the first touch connection electrodes, the second touch electrodes 640_T, and the second touch connection electrodes 640_C. A portion of the first touch electrodes 640_R, a portion of the first touch connection electrodes, a portion of the second touch electrodes 640_T, and a portion of the second touch connection electrodes 640_C may be disposed to overlap the bank 420.

Each of the first touch electrodes 640_R, the second touch electrodes 640_T, the first touch connection electrodes, and the second touch connection electrodes 640_C may include an opaque conductive material having low resistance. For example, each of the first touch electrodes 640_R, the second touch electrodes 640_T, the first touch connection electrodes, and the second touch connection electrodes 640_C may have a single-layer structure or a multilayer structure of one or more selected from among Mo, Cu, Ti, Al, Cr, Au, Ni, Nd, W, and a transparent conductive oxide, but is not limited thereto.

For example, each of the first touch electrodes 640_R, the second touch electrodes 640_T, the first touch connection electrodes, and the second touch connection electrodes 640_C may have a three-layer structure of Ti/Al/Ti of conductive metals, but is not limited thereto. The first touch electrodes 640_R, the second touch electrodes 640_T, the first touch connection electrodes, and the second touch connection electrodes 640_C may be formed of the same or substantially the same material as the source electrode 250 and the drain electrode 270.

A touch buffer layer 610 may be on the encapsulation layer 500. The touch buffer layer 610 may block a chemical liquid (e.g., a developer or etchant) used in fabrication processing of the touch sensor layer 600, external moisture, and the like from permeating into the light-emitting device layer 400. In addition, it is possible to reduce or prevent a plurality of touch sensor metals above the touch buffer layer 610 from being short-circuited by external impact, and block an interference signal that may occur when the touch sensor layer is driven.

The touch buffer layer 610 may include at least one selected from among inorganic insulating materials such as SiNx and SiOx; and organic insulating materials such as benzocyclobutene, an acrylic resin, an epoxy resin, a phenolic resin, a polyamide resin, and a polyimide resin, but is not limited thereto.

The first touch connection electrodes may be disposed on the touch buffer layer 610. For example, the first touch connection electrodes may be disposed between the first touch electrodes 640_R adjacent in the first direction (or X-axis direction). The first touch connection electrodes may electrically connect the first touch electrodes 640_R disposed adjacent in the first direction (or X-axis direction), but is not limited thereto.

The first touch connection electrodes may overlap the second touch connection electrodes 640_C connecting the second touch electrodes 640_T adjacent in the second direction (or Y-axis direction). The first touch connection electrodes and the second touch connection electrodes 640_C may be on different layers, and thus may be electrically insulated from each other.

A touch insulating layer 630 may be on the touch buffer layer 610 and the first touch connection electrodes. The touch insulating layer 630 may have holes through which the first touch electrodes 640_R and the first touch connection electrodes are electrically connected. The touch insulating layer 630 may include a single layer of SiNx or SiOx or a multilayer of thereof, but is not limited thereto.

The first touch electrodes 640_R, the second touch electrodes 640_T, and the second touch connection electrodes 640_C may be on the touch insulating layer 630 in the active area AA. The first touch electrodes 640_R may be connected to the first touch connection electrodes through the holes in the touch insulating layer 630.

The second touch electrodes 640_T adjacent in the second direction (or Y-axis direction) may be connected by the second touch connection electrodes 640_C. The second touch electrodes 640_T and the second touch connection electrodes 640_C may be on the same layer. For example, the second touch connection electrodes 640_C may be on the same layer as and between the second touch electrodes 640_T. The second touch connection electrodes 640_C may extend from the second touch electrodes 640_T.

The first touch electrodes 640_R, the second touch electrodes 640_T, and the second touch connection electrodes 640_C may be disposed on the same layer. For example, the first touch electrodes 640_R, the second touch electrodes 640_T, and the second touch connection electrodes 640_C may be disposed on the touch insulating layer 630. The first touch electrodes 640_R, the second touch electrodes 640_T, and the second touch connection electrodes 640_C may be formed in the same process.

The first touch lines 670 and the second touch lines 680 may be on the touch insulating layer 630 in the non-active area NA. At least one of the first touch lines 670 and the second touch lines 680 may overlap the cathode 450. The touch dummy TD may be further disposed between the first touch lines 670 and an edge of the substrate 110.

A touch planarization layer 650 may be on the first touch electrodes 640_R, the second touch electrodes 640_T, the first touch connection electrodes, the second touch connection electrodes 640_C, the first touch lines 670, second touch lines 680, and the touch dummy TD. The touch planarization layer 650 may protect the touch electrodes and the touch lines disposed therebelow and reduce or planarize a stepped portion due to the electrode in the active area.

The touch planarization layer 650 may include at least one selected from among an acrylic resin, an epoxy resin, a phenol resin, a polyamide resin, a polyimide resin, an unsaturated polyester resin, a polyphenylene resin, and a polyphenylene sulfide resin, but is not limited thereto.

The above descriptions with respect to FIG. 6 and FIG. 7 provide various example embodiments of the arrangement and structure of the display device of the present application for illustrative purpose only, and embodiments of the present disclosure are not limited thereto. For example, the spacer 430 may be omitted; the shapes and numbers of the signal lines SL, the first touch lines 670 and the blocking pattern holes BH are not limited to those shown in FIGS. 6-7; and the blocking pattern may also include another blocking pattern that extends from the second blocking pattern BP2 in a vertical direction towards the substrate 110, so as to better block the noises of the signal lines from the touch lines.

Hereinafter, another embodiment of the present disclosure will be described with reference to FIG. 8.

Figure 8:
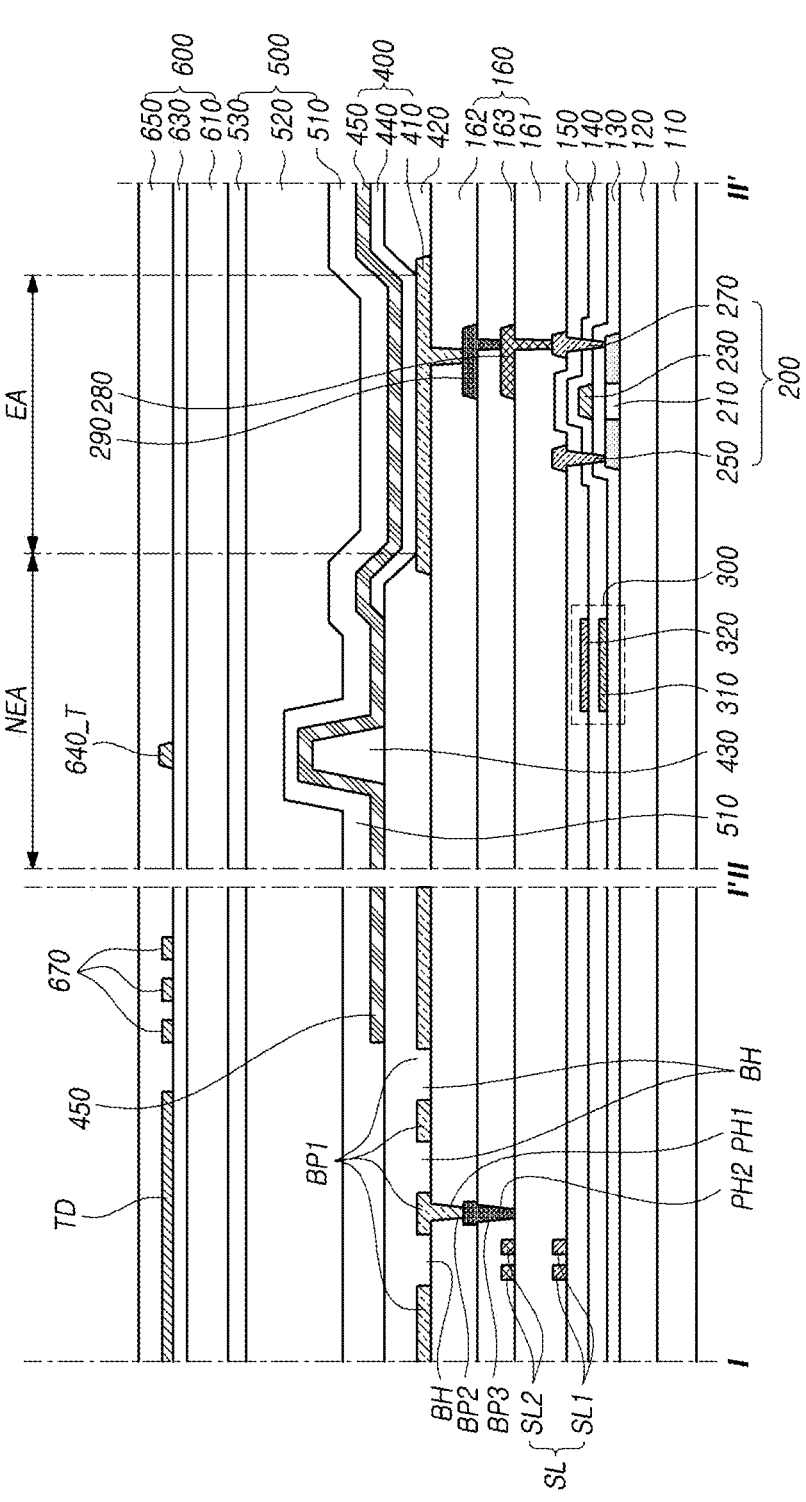
FIG. 8 is a cross-sectional view illustrating the display driver unit and the touch sensor layer according to another embodiment of the present disclosure disposed on a substrate.

FIG. 8 is a cross-sectional view illustrating a display device 100 according to another embodiment of the present disclosure.

The display device 100 according to another embodiment of the present disclosure may further include a third blocking pattern BP3. The display device 100 illustrated in FIG. 8 is substantially the same as the display device illustrated in FIG. 7, except for a third planarization layer 163, a second connection electrode 290, and the third blocking pattern BP3, and thus a repeated description thereof will be omitted or may be briefly provided.

The planarization layer 160 of the display device 100 illustrated in FIG. 8 may be provided as three layers in consideration of the arrangement of electrodes. Because a variety of signal lines increase along with evolution of the display device 100 into a higher resolution, the planarization layer may be provided as three or more layers.

The blocking pattern may include the first blocking pattern BP1, the second blocking pattern BP2, and the third blocking pattern BP3.

When the planarization layer 160 is provided as three layers, the planarization layer 160 may include the first planarization layer 161, the second planarization layer 162, and the third planarization layer 163.

The third planarization layer 163 may be disposed between the first planarization layer 161 and the second planarization layer 162.

A hole may be formed in the third planarization layer 163 in the active area AA, and the second connection electrode 290 may be further disposed in the hole. The second planarization layer 162 having a hole may be on the third planarization layer 163 and the second connection electrode 290. The anode 410 may be above the second planarization layer 162 or in the hole of the second planarization layer 162. Thus, the thin-film transistor 200 and the anode 410 may be electrically connected through the first connection electrode 280 and the second connection electrode 290.

One end (or a portion) of the first connection electrode 280 may be connected to the thin-film transistor, and the other end (or another portion) of the first connection electrode 280 may be connected to the second connection electrode 290. One end (or a portion) of the second connection electrode 290 may be electrically connected to the first connection electrode 280, and the other end (or another portion) of the second connection electrode 290 may be electrically connected to the anode.

At least one second hole PH2 may be formed in the third planarization layer 163 in the non-active area NA, and the third blocking pattern BP3 may be disposed in the second hole PH2. One end (or a portion) of the third blocking pattern BP3 may be in contact with the second blocking pattern BP2.

The second planarization layer 162 may be on the third planarization layer 163 and the third blocking pattern BP3 in the non-active area NA. The first hole PH1 may be formed in the second planarization layer 162, and the second blocking pattern BP2 may be disposed in the first hole PH1.

A portion of the first hole PH1 and a portion of the second hole PH2 may overlap the first blocking pattern BP1. The first blocking pattern BP1 may be on the second planarization layer 162 and the second blocking pattern BP2.

At least a portion of the third blocking pattern BP3 may be in contact with the first blocking pattern BP1 and the second blocking pattern BP2. For example, one end (or a portion) of the third blocking pattern BP3 may be in contact with the first blocking pattern BP1, and the other end (or another portion) of the third blocking pattern BP3 may be connected to the second blocking pattern BP2. The second blocking pattern BP2 and the third blocking pattern BP3 may be disposed on the same layer. For example, the second blocking pattern BP2 and the third blocking pattern BP3 may be on the third planarization layer 163. The second blocking pattern BP2 and the third blocking pattern BP3 may be disposed in the second hole PH2 of the third planarization layer 163.

The second blocking pattern BP2 and the third blocking pattern BP3 may be formed of the same material. The second blocking pattern BP2 and the third blocking pattern BP3 may have the same structure. The second blocking pattern BP2 and the third blocking pattern BP3 may be formed in the same process.

Each of the second blocking pattern BP2 and the third blocking pattern BP3 may have a single-layer structure or a multilayer structure formed of one or more selected from among Mo, Cu, Ti, Al, Cr, Au, Ni, Nd, W, a transparent conductive oxide, or alloys thereof, but is not limited thereto.

The second blocking pattern BP2 and the third blocking pattern BP3 may extend from the first blocking pattern BP1 and be disposed vertically. Since the first blocking pattern BP1, the second blocking pattern BP2 and the third blocking pattern BP3 may be disposed between the signal lines SL and the touch electrodes, the effect of noise originating from the signal lines SL on the touch lines may be reduced.

The above-described embodiments of the present disclosure will be briefly reviewed as follows.

The display device according to embodiments of the present disclosure may comprise: a substrate 110 including an active area and a non-active area surrounding the active area; a signal line SL in the non-active area such that a display signal is supplied through the signal line; a touch line 670 on the signal line such that a touch signal is supplied through the touch line; a first blocking pattern BP1 between the signal line and the touch line and having a blocking pattern hole BH; and a second blocking pattern BP2 connected to the first blocking pattern.

The first blocking pattern BP1 and the second blocking pattern BP2 may be on different layers.

The signal line and the touch line may be disposed so as to be spaced apart at least in part from each other.

At least a portion of the signal line SL may overlap the blocking pattern hole BH.

The first blocking pattern BP1 and the second blocking pattern BP2 may be between the signal line SL and the touch line 670.

The display device according to embodiments of the present disclosure may further include: a thin-film transistor on the substrate; and a planarization layer 160 on the thin-film transistor 200 and including a first planarization layer 161 and a second planarization layer 162.

The first blocking pattern BP1 may be on the second planarization layer 162, and the second blocking pattern BP2 may be in the first hole PH1 of the second planarization layer 162.

The planarization layer 160 may further include: a third planarization layer 163 interposed between the first planarization layer 161 and the second planarization layer 162; and a third blocking pattern BP3 in a second hole PH2 in the third planarization layer.

The third blocking pattern BP3 may be in contact with the first blocking pattern BP1 and the second blocking pattern BP2.

A portion of the first hole PH1 and a portion of the second hole PH2 may overlap the first blocking pattern BP1.

The third blocking pattern BP3 may be between the signal line SL and the touch line 670.

The display device according to embodiments of the present disclosure may further include a touch dummy TD between the touch line 670 and an edge of the substrate 110.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device comprising:
a substrate including an active area and a non-active area at a periphery of the active area;
a signal line, in the non-active area, configured to supply a display signal;
a touch line, over the signal line, configured to supply a touch signal;
a first blocking pattern between the signal line and the touch line; and
a second blocking pattern connected to the first blocking pattern,
wherein the second blocking pattern is in contact with the first blocking pattern and extends from the first blocking pattern in a direction vertical toward the substrate,
wherein the second blocking pattern is between the signal line and the touch line, and
wherein the second blocking pattern is disposed so as not to overlap the signal line.

2. The display device according to claim 1, wherein the first blocking pattern and the second blocking pattern include a conductive material.

3. The display device according to claim 1, wherein the first blocking pattern and the second blocking pattern are on different layers.

4. The display device according to claim 1, wherein the signal line and the touch line are spaced apart at least in part from each other.

5. The display device according to claim 1, wherein the first blocking pattern has a blocking pattern hole.

6. The display device according to claim 5, wherein at least a portion of the signal line overlaps the blocking pattern hole in a plan view.

7. The display device according to claim 1, further comprising:
a thin-film transistor on the substrate; and
a planarization layer on the thin-film transistor,
wherein the planarization layer includes a first planarization layer and a second planarization layer, the second planarization layer having a first hole.

8. The display device according to claim 7, further comprising:
a light-emitting device layer on the planarization layer, the light-emitting device including an anode, an emitting layer on the anode, and a cathode on the emitting layer,
wherein the cathode extends to the non-active area to overlap in a plan view with the first blocking pattern or the touch line.

9. The display device according to claim 7, wherein the signal line includes a first signal line and a second signal line on a different layer than the first signal line.

10. The display device according to claim 9, wherein the first signal line is under the first planarization layer, and the second signal line is on the first planarization layer.

11. The display device according to claim 7, wherein the first blocking pattern is on the second planarization layer, and
wherein the second blocking pattern is in the first hole of the second planarization layer.

12. The display device according to claim 7, further comprising:
a third planarization layer interposed between the first planarization layer and the second planarization layer; and
a third blocking pattern in a second hole in the third planarization layer.

13. The display device according to claim 12, wherein the third blocking pattern is in contact with the first blocking pattern and the second blocking pattern.

14. The display device according to claim 12, wherein the third blocking pattern extends from the first blocking pattern in the vertical direction.

15. The display device according to claim 12, wherein a portion of the first hole and a portion of the second hole overlap in a plan view the first blocking pattern.

16. The display device according to claim 12, wherein the third blocking pattern is between the signal line and the touch line.

17. The display device according to claim 1, further comprising a touch dummy outside the touch line, wherein the touch dummy is between the touch line and an edge of the substrate.

18. The display device according to claim 17, wherein the touch dummy is outside the touch line and overlapping with the signal line.

19. The display device according to claim 18, wherein the touch dummy includes a conductive material and is configured to have a constant voltage applied thereto.

20. The display device according to claim 18, wherein the touch dummy includes a same material as that of the touch line and is on a same layer as the touch line.

21. A display device comprising:
a substrate including an active area and a non-active area at a peripheral of the active area;
a signal line, in the non-active area, configured to supply a display signal;

a touch line, over the signal line, configured to supply a touch signal; and a blocking pattern between the signal line and the touch line, wherein the blocking pattern includes a conductive material and is configured to have a constant voltage applied thereto, and wherein the signal line includes a first signal line and a second signal line on a different layer than the first signal line.

* * * * *